(12) United States Patent
Tanaka et al.

(10) Patent No.: US 7,769,279 B2
(45) Date of Patent: *Aug. 3, 2010

(54) HEAT TREATMENT APPARATUS

(75) Inventors: Sumi Tanaka, Nirasaki (JP); Takayuki Kamaishi, Nirasaki (JP); Kouki Suzuki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 401 days.

This patent is subject to a terminal disclaimer.

(21) Appl. No.: 11/773,241

(22) Filed: Jul. 3, 2007

(65) Prior Publication Data

US 2008/0011734 A1 Jan. 17, 2008

Related U.S. Application Data

(63) Continuation of application No. 11/350,766, filed on Feb. 10, 2006, now Pat. No. 7,250,094, which is a continuation of application No. PCT/JP2004/011551, filed on Aug. 11, 2004.

(30) Foreign Application Priority Data

Aug. 11, 2003 (JP) ............................. 2003-207211

(51) Int. Cl.
*A21B 2/00* (2006.01)
(52) U.S. Cl. .................... 392/416; 392/407; 392/411; 219/390
(58) Field of Classification Search ................ 392/416, 392/407, 411
See application file for complete search history.

(56) References Cited

U.S. PATENT DOCUMENTS

| 5,938,850 | A | 8/1999 | Arami et al. |
|---|---|---|---|
| 5,985,033 | A | 11/1999 | Yudovsky et al. |
| 7,250,094 | B2 * | 7/2007 | Tanaka et al. .......... 156/345.52 |
| 2002/0045362 | A1 | 4/2002 | Yang et al. |
| 2003/0051665 | A1 | 3/2003 | Zhao et al. |
| 2004/0020599 | A1 | 2/2004 | Tanaka et al. |
| 2004/0084315 | A1 | 5/2004 | Mizohata et al. |
| 2004/0211764 | A1 | 10/2004 | Doering et al. |

FOREIGN PATENT DOCUMENTS

| JP | 7-58016 | 3/1995 |
|---|---|---|
| JP | 8-302473 | 11/1996 |
| JP | 9-50965 | 2/1997 |
| JP | 2001-0509645 | 7/2001 |
| WO | WO 99/03131 | 1/1999 |

* cited by examiner

*Primary Examiner*—Thor S Campbell
(74) *Attorney, Agent, or Firm*—Oblon, Spivak, McClelland, Maier & Neustadt, L.L.P.

(57) ABSTRACT

A processing gas is prevented from entering into a space below a placement table. A supporting surface 62 for supporting the lower face of a placement table 58 is provided at an inner circumferential portion of the upper end of a support 56. A circumferentially extending purge gas groove 64 is formed outside the supporting surface 62, in an intermediate circumferential portion of the upper end of the support 56. A narrow flow path 68 is provided outside the purge gas groove 64, at a position corresponding to an outer circumferential portion of the upper end of the support 56. A purge gas fed from purge gas-feeding means 66 into the purge gas groove diffuses in the circumferential direction in the purge gas groove 64 and flows out to the outside from the narrow flow path 68. Such a flow of the purge gas prevents a processing gas from entering into the purge gas groove 64 and a space S1 below the placement table.

14 Claims, 7 Drawing Sheets

HEAT TREATMENT APPARATUS

This application is a Continuation Application of U.S. application Ser. No. 11/350,766, filed on Feb. 10, 2006, the entire content of which are hereby incorporated by reference herein, which is a Continuation of PCT International Application No. PCT/JP2004/011551 filed on Aug. 11, 2004, which designated the United States, and which claims the benefit of priority under 35 U.S.C. §119 from Japanese Patent Application No. 2003-207211, filed on Aug. 11, 2003.

FIELD OF THE INVENTION

The present invention relates to a heat-treating apparatus for performing a specified heat treatment on an object to be processed such as a semiconductor wafer.

BACKGROUND OF THE INVENTION

Generally, various processes, e.g., a film forming process, an etching process, an oxidation/diffusion process, an annealing process and a modification process, are performed on a semiconductor wafer serving as an object to be processed in a manufacturing process of a semiconductor integrated circuit. For example, in the film forming process, a polysilicon film, a $SiO_2$ film, a W (tungsten) film, a WSi (tungsten silicide) film, a Ti (titanium) film, a TiN (titanium nitride) film, a TiSi (titanium silicide) film and the like are deposited on a surface of the wafer. A heat-treating apparatus performing such a film forming process is disclosed in, for example, Japanese Patent Laid-open Application Nos. H9-237763 and 2001-23966.

Here, a conventional general single-wafer heat-treating apparatus will be described with reference to FIG. 7. FIG. 7 shows a configuration of a conventional general single-wafer heat-treating apparatus. The heat-treating apparatus includes an evacuatable processing chamber 2, wherein a shower head 4 for introducing various necessary gases into the processing chamber 2 is installed in a ceiling portion thereof. Further, inside the processing chamber 2, a placement table 8 of a thin plate shape is supported on a cylindrical support column 6 which is extended upward from a bottom portion of the chamber, and a semiconductor wafer W is mounted on an upper surface of the placement table 8. A plurality of heating lamps 10 is installed under the processing chamber 2. Heat rays emitted from the heating lamps 10 are introduced into the chamber through a transmission window 12 provided in the bottom portion of the chamber, whereby the wafer W as well as the placement table 8 is heated.

A $N_2$ gas serving as a purge gas is supplied into a space under the placement table 8 by a purge gas feeding unit 14 to thereby prevent a processing gas from entering into the space under the placement table 8. Accordingly, an unnecessary film is prevented from being adhered to an upper surface of the transmission window 12 or a lower surface of the placement table 8. If an unnecessary film is adhered to the transmission window 12, a transmittance of the heat rays becomes decreased to thereby deteriorate a heating efficiency. Further, if an unnecessary film is unevenly adhered to the lower surface of the placement table 8, a light absorptance becomes nonuniform and a temperature distribution is developed on the placement table 8 to thereby decrease an in-surface uniformity of the wafer's temperature. In order to overcome such a drawback, it is very important to supply the above-mentioned purge gas.

For example, in the aforementioned film forming process, if a diffusion rate of a processing gas used for film forming is not so high, the processing gas can be sufficiently prevented from entering into the space under the placement table 8. However, in case of using a processing gas having a very high diffusion rate, e.g., a silane gas, even though the purge gas is supplied into the space under the placement table 8, the processing gas enters into the space under the placement table 8 from a small gap, whereby an unnecessary film can be adhered to the lower surface of the placement table 8 or the upper surface of the transmission window 12.

In order to avoid such a phenomenon, it can be considered to substantially increase a flow rate of the purge gas. But, if so, a pressure inside the space under the placement table 8 is also increased. Since the increased pressure is exerted on the whole lower surface of the placement table 8, it is possible that the placement table 8 is raised to thereby generate a misalignment of the placement table. Further, in case that the placement table 8 is strongly fixed to the support column 6, the placement table 8 itself can be destroyed. Besides, since a flow speed of the purge gas jetting outwardly through the gap between the upper surface of the support column 6 and the lower surface of the placement table 8 becomes considerably greater, a circumferential portion of the placement table 8 is partially cooled to thereby deteriorate the in-surface uniformity of the temperature of the wafer W. Accordingly, it is not allowable to sharply increase the flow rate of the purge gas.

SUMMARY OF THE INVENTION

The present invention has been conceived to effectively resolve the above drawbacks; and it is, therefore, an object of the present invention to provide a heat-treating apparatus capable of definitely preventing a processing gas from entering into a space under a placement table for mounting an object to be processed thereon.

The above-mentioned object is achieved by the present invention disclosed in claims. In accordance with the present invention, there is provided a heat-treating apparatus, including an evacuatable processing chamber; a cylindrical support column extending upward from a bottom portion of the processing chamber; a placement table of a plate shape, supported on a top end of the support column, for mounting an object to be processed thereon; a heating lamp for heating the object mounted on the placement table; and a gas feeding unit for supplying a processing gas in the processing chamber, wherein a supporting surface is formed in a circumferential direction at an inner circumferential portion of a top portion of the cylindrical support column to support a lower surface of a circumferential portion of the placement table in contact therewith, a purge gas groove for flowing a purge gas therein is formed in a circumferential direction at an intermediate circumferential portion of the top portion of the cylindrical support column, a narrow flow path for discharging the purge gas flowing in the purge gas groove while preventing the processing gas from entering into the purge gas groove is formed around at an outer circumferential portion of the top portion of the cylindrical support column, and a purge gas feeding unit for supplying the purge gas in the purge gas groove is installed.

Consequently, the purge gas supplied into the purge gas groove is distributed approximately uniformly in the purge gas groove, and discharged outside through the narrow flow path. The purge gas is discharged from the narrow flow path with a flow speed increased due to a throttling effect in the narrow flow path. Thus, even though the processing gas has a high diffusion rate, it is possible to prevent the processing gas from entering into the purge gas groove and the space under the placement table through the narrow flow path.

A labyrinth groove may be disposed on a surface of a member for defining the narrow flow path to definitely prevent the processing gas from entering.

In accordance with an embodiment of the present invention, the narrow flow path is a gap between an upper surface of the outer circumferential portion of the cylindrical support column and a lower surface of the placement table facing to the upper surface, and the purge gas groove formed at the intermediate circumferential portion of the top portion of the cylindrical support column is a gap between the outer circumferential portion and the inner circumferential portion of the top portion of the cylindrical support column. In this case, the labyrinth groove may be disposed in a circumferential direction on the upper surface of the outer circumferential portion of the cylindrical support column.

A cylindrical pressing member having a pressing portion for pressing an upper surface of the circumferential portion of the placement table may be disposed in a radial direction outside the cylindrical support column at a specified interval, whereby a purge gas discharge flow path may be formed between an inner circumferential surface of the pressing member and an outer circumferential surface of the support column and the purge gas discharged from the narrow flow path flows down therethrough. As described above, the purge gas discharge flow path prevents the processing gas from reaching the narrow flow path. Preferably, the pressing member is made of a low heat conductive material.

Preferably, a lower portion of the pressing member is fixed at the bottom portion of the processing chamber via a resilient member, whereby the placement table is movable upward by resiliently deforming the resilient member when an upward force is applied to the placement table. By such a fixed structure, even though a pressure in the space under the placement table is higher than that in the processing space above the placement table, the placement table is temporarily displaced to reduce the pressure in the space under the placement table, whereby the placement table can be prevented from being damaged.

Preferably, both the supporting surface and the lower surface of the circumferential portion of the placement table in contact with the supporting surface are mirror finished. Accordingly, both surfaces become to have a close contact and it is possible to prevent the processing gas from entering into the space under the placement table even if the processing gas enters into the purge gas groove.

A light blocking member may be installed at the support column to prevent light emitted from the heating lamp from leaking outward in a radial direction of the support column. The light blocking member may be formed of a light reflective member.

Preferably, the heat-treating apparatus is provided with a purge gas feeding unit for supplying a purge gas in a space under the placement table inside the support column. Consequently, it is possible to effectively prevent the processing gas from entering into the space. In this case, preferably, a cylindrical flow path forming member is disposed inward in a radial direction of the cylindrical support column at a specified interval, and formed between an inner circumferential surface of the support column and an outer circumferential surface of the flow path forming member is a purge gas outlet passage through which the purge gas supplied in the space under a lower surface of the placement table flows down, having a lower portion connected to a vacuum exhaust system for exhausting the processing chamber to vacuum via a purge gas passage.

DETAILED DESCRIPTION OF THE PREFERRED EMBODIMENTS

Hereinafter, there will be described heat-treating apparatus in accordance with preferred embodiments of the present invention with reference to accompanying drawings.

First Preferred Embodiment

Figure 1:
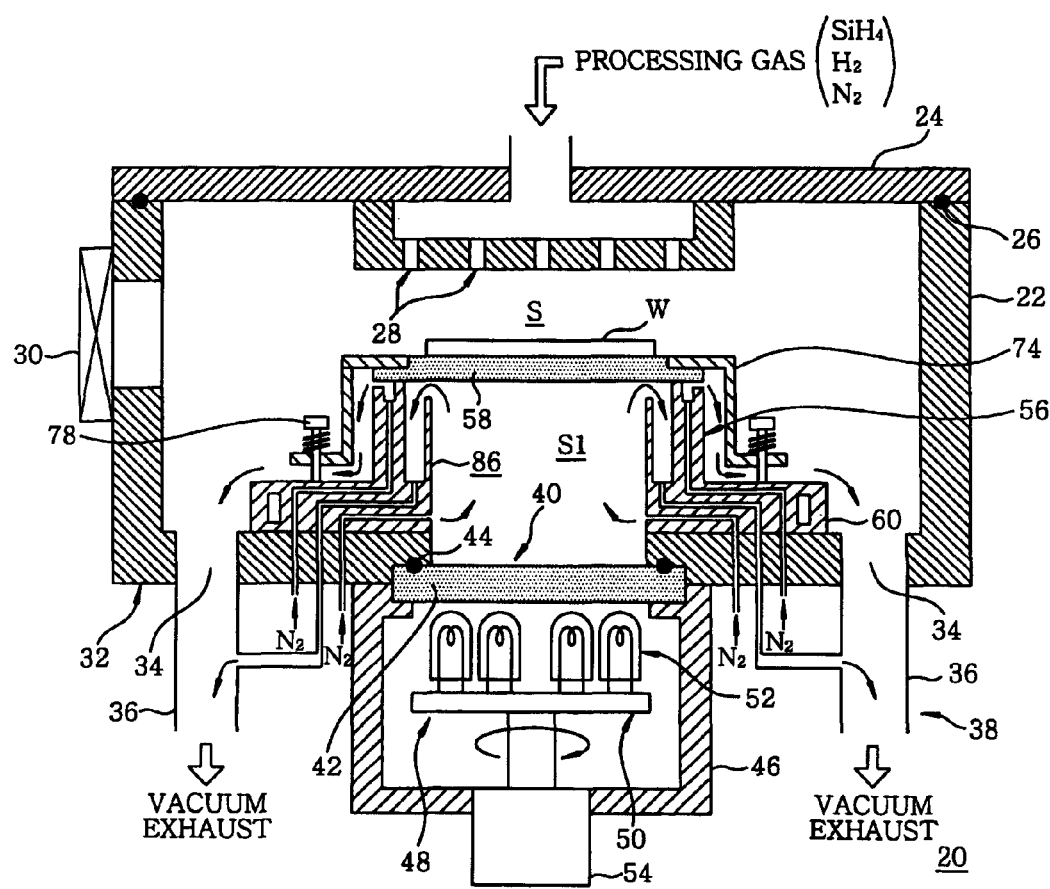
FIG. 1 provides a cross sectional view showing a configuration of a heat-treating apparatus in accordance with a first preferred embodiment of the present invention.
Figure 2:
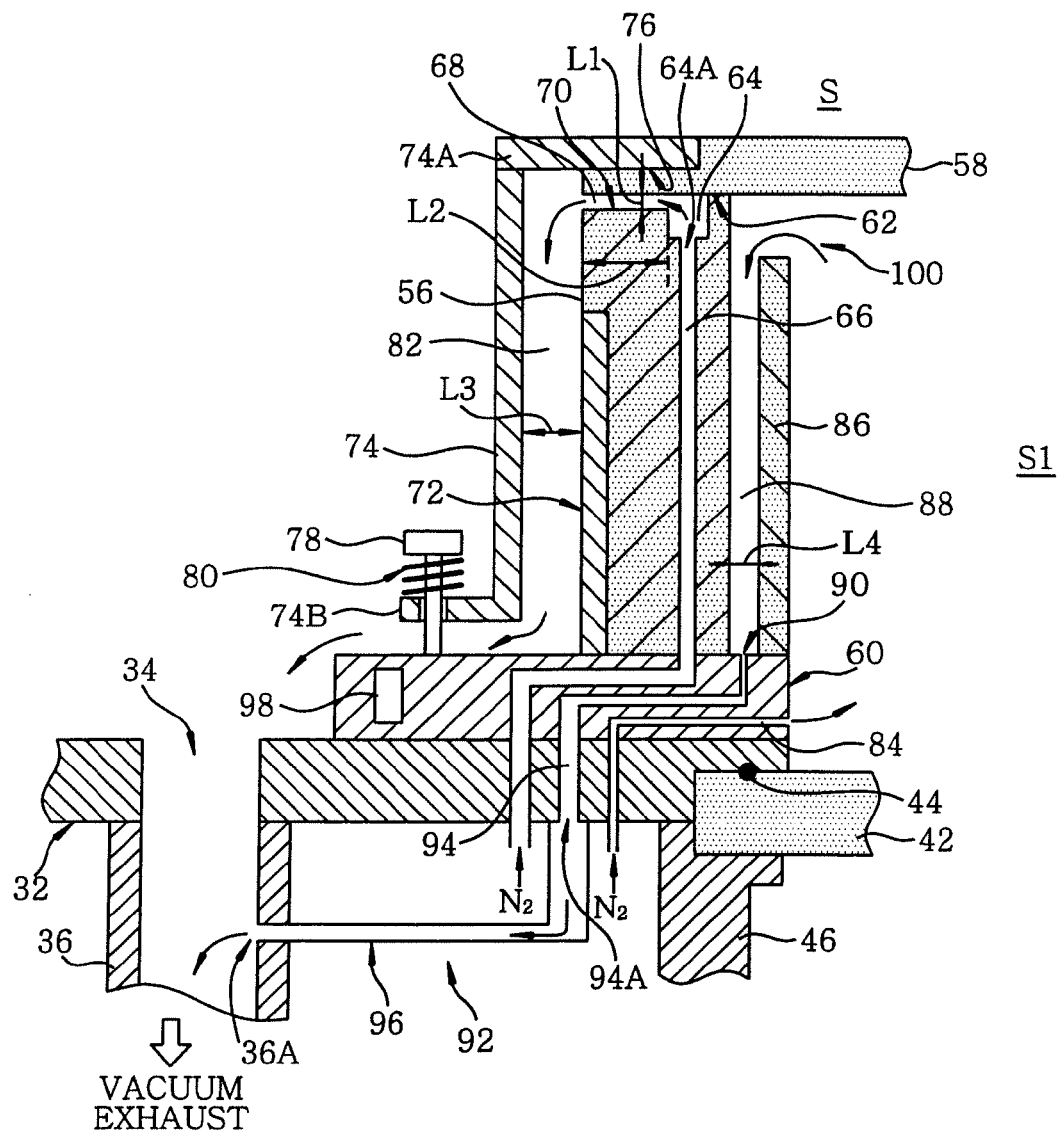
FIG. 2 illustrates a magnified sectional view showing a support column and its neighboring members depicted in FIG. 1.
Figure 3:
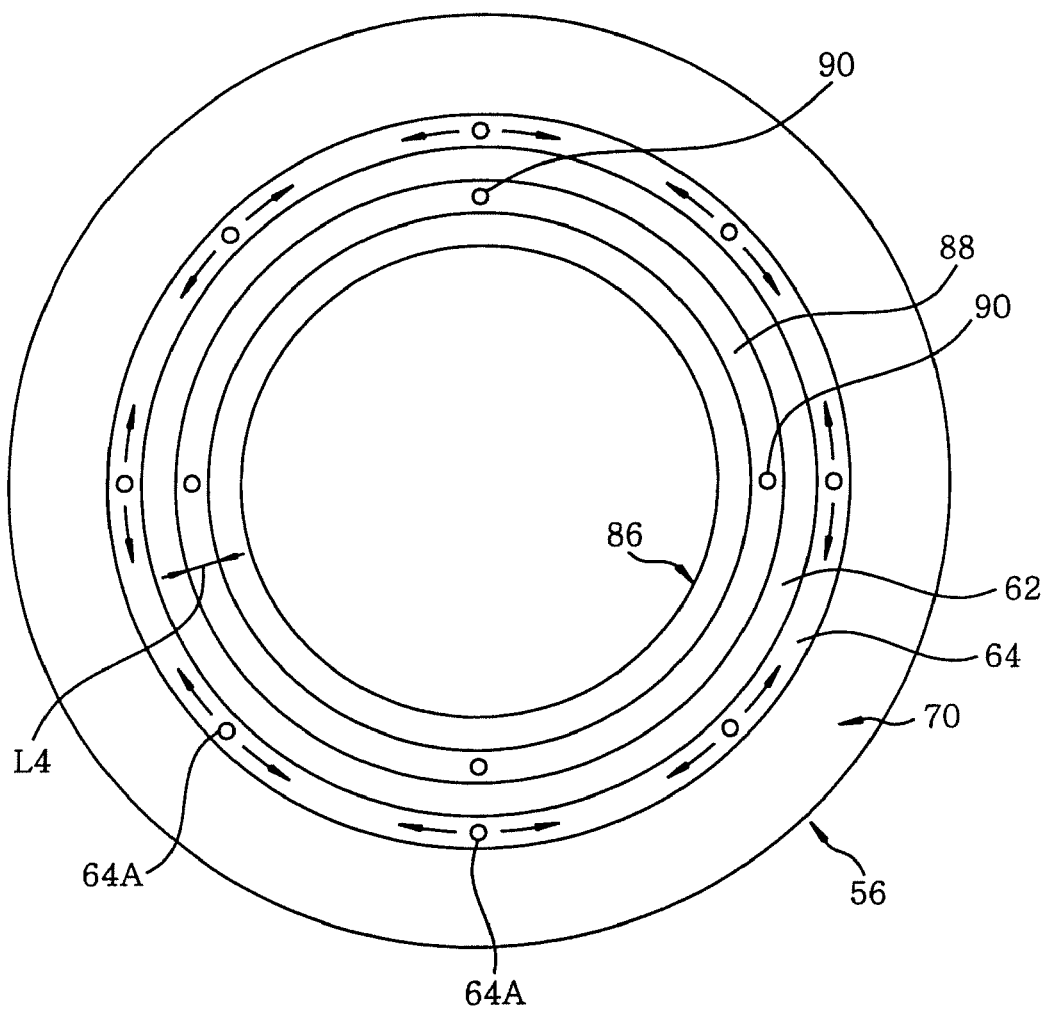
FIG. 3 describes a magnified plan view showing the support column depicted in FIG. 1.

First, there will be a first preferred embodiment of the present invention with reference to FIGS. 1 to 3. FIG. 1 provides a cross sectional view showing a configuration of a heat-treating apparatus in accordance with a first preferred embodiment of the present invention; FIG. 2 illustrates a magnified sectional view showing a support column and its neighboring members depicted in FIG. 1; and FIG. 3 describes a magnified plan view showing the support column depicted in FIG. 1. Herein, a case of forming a polysilicon film by using a CVD method exemplifies a heat treatment.

A heat-treating apparatus 20 has an evacuatable cylindrical processing chamber 22 which is made of, e.g., aluminum. A shower head 24 serving as a gas feeding unit for introducing a necessary processing gas into the processing chamber 22, e.g., a shower head 24, is airtightly installed via a sealing member 26 such as an O-ring in a ceiling portion of the processing chamber 22. A plurality of gas injection holes 28 is provided on a lower surface of the shower head 24, and a processing gas is supplied into a processing space S through the gas injection holes 28. In an illustrated embodiment, a silane gas ($SiH_4$), a $H_2$ gas and a $N_2$ gas (a carrier gas) are used as a processing gas.

Further, referring to FIG. 1 in which the shower head 24 is simplified, it may look like as if all processing gases are mixed in the shower head 24 and then supplied into the processing space S. However, the shower head 24 may be configured to be suitable for a gas feeding method called as a so-called post-mix method. In this case, a plurality of divided rooms is provided in the shower head 24, so that different gases are introduced into respective rooms and those gases are mixed for the first time when injected into the processing space S from the shower head 24. In this embodiment, practically, a silane gas, which is supplied into the shower head 24 together with a carrier gas, is diffused separately from a $H_2$ gas in the shower head 24, and the silane gas and the $H_2$ gas are mingled after being injected into the processing space S.

Disposed on a sidewall of the processing chamber 22 is a gate valve 30 to be opened and closed when a semiconductor wafer W serving as an object to be processed is loaded or unloaded into or from the processing chamber 22. A plurality of gas exhaust ports 34 is formed in a circumferential portion of a bottom wall 32 of the processing chamber 22. Plural lines 36, each having a relatively large-diameter, are connected to the gas exhaust ports 34, respectively, and those lines 36 constitute parts of a vacuum exhaust system 38 in which a vacuum pump 22 is installed. Consequently, an atmosphere in the processing chamber 22 can be exhausted to vacuum approximately uniformly. An opening 40 of a large diameter is formed in a central portion of the bottom wall 32 of the processing chamber 22, and a transmission window 42 having a sufficient pressure resistance to withstand against inside pressure is airtightly installed at the opening 40 via a sealing member 44 such as an O-ring. The transmission window 42 is made of transparent quartz, for example.

A lamp housing 46 provided underneath the transmission window 42 is installed to cover the transmission window 42. A heating lamp unit 48 for heating the wafer W is installed in the lamp housing 46. In the illustrated embodiment, the heating lamp unit 48 includes a lamp mount 50 serving as a reflective plate and a plurality of heating lamps 52 mounted on the lamp mount 50. The lamp mount 50 is connected to a rotation axis of a motor 54 and the heating lamps 52 irradiate heat rays toward the wafer W while being rotated.

A cylindrical support column 56 is installed on the bottom wall 32 of the processing chamber 22 and extended upward therefrom. A placement table 58 of a thin plate shape is supported on a top portion of the support column 56 and the semiconductor wafer W is mounted on an upper surface of the placement table 58. In the illustrated embodiment, the placement table 58 is a circular plate made of black graphite, on which a gray SiC coating is performed. In particular, as specifically shown in FIG. 2, an annular base plate 60 is mounted on an upper surface of the bottom wall 32 of the processing chamber 22 to surround the opening 40 and the cylindrical support column 56 is made to stand up on the base plate 60. In the illustrated embodiment, the base plate 60 is made of aluminum and the support column 56 is made of transparent quartz.

The cylindrical support column 56 has a specified thickness, e.g., about 9.5 mm. A top portion of the support column 56 has an inner circumferential portion, an outer circumferential portion and an intermediate circumferential portion interposed therebetween. The inner circumferential portion of the top portion of the support column 56 is formed to have a higher height than the outer and the intermediate circumferential portion, whereby an upper surface of the inner circumferential portion serves as an annular supporting surface 62, which is in contact with a lower surface of a circumferential portion of the placement table 58 to support the placement table 58. Both the supporting surface 62 and the lower surface of the circumferential portion of the placement table 58 are mirror finished to thereby provide an airtight, uniform contact with each other. A width of the supporting surface 62 is about 2.7 mm, for example.

The intermediate circumferential portion of the top portion of the support column 56 is formed to have a lower height than the inner and the outer circumferential portion, whereby an annular purge gas groove 64 surrounded by the inner and the outer circumferential portion is provided in the intermediate circumferential portion. The purge gas groove 64 has a width of about 2.2 mm and a depth of about 2.0 mm. On a lower surface of the purge gas groove 64, i.e., an upper surface of the intermediate circumferential portion, a plurality of gas holes 64A are formed at specified intervals in a circumferential direction. Connected to the gas holes 64A are purge gas introduction passages 66 serving as a first purge gas feeding unit, respectively. The purge gas introduction passages 66 are extended vertically inside the support column 56, respectively, and lower portions thereof pass through the base plate 60 and the bottom wall 32. A purge gas whose flow rate is controlled is supplied from a gas source (not shown) thereto. A $N_2$ gas or a nonreactive gas such as an Ar gas can be used as the purge gas, and a $N_2$ gas is used in the present embodiment.

Further, an upper surface of the outer circumferential portion of the support column 56 is lower than the upper surface of the inner circumferential portion, i.e., the supporting surface 62, whereby a very narrow gap 68 is formed between an upper surface 70 of the outer circumferential portion of the support column 56 and a lower surface of the circumferential portion of the placement table 58. The gap 68 has a width L1 of, e.g., a few to several tens of μm and a depth L2 of, e.g., about 4.6 mm in a diametrical direction. The gap 68 provides a narrow flow path (hereinafter, referred to as "narrow flow path 68") for discharging the purge gas supplied into the purge gas groove 64 to the outside. The narrow flow path 68 is extended in a ring shape along a periphery of the support column 56. The narrow flow path 68 can be formed such that the upper surface 70 is a few to several tens of μm lower than the supporting surface 62 by performing a cutting off or a blast processing on the upper surface 70 of the outer circumferential portion of the support column 56.

A light blocking member 72 is installed all over an outer circumferential surface of the support column 56. The light blocking member 72 blocks the heat rays emitted from heating lamps 52 to prevent the heat rays from leaking out. Thus, parts disposed outside the light blocking member 72 are protected from heat. The light blocking member 72 can be formed of a light absorptive material made of black or gray ceramic. Additionally, a light reflective material such as aluminum can be used for the light blocking member 72 to improve a heating efficiency of the wafer W.

A cylindrical pressing member 74 for pressing the placement table 58 toward the support column 56 is installed outside the support column 56 at a specified interval. The pressing member 74 is formed of a low thermal conductive material, e.g., quartz, and an annular pressing portion 74A is installed at a top end thereof. A lower surface of an inner circumferential portion of the pressing portion 74A is in contact with an upper surface of the circumferential portion of the placement table 58, whereby the placement table 58 is pressurized and fixed on the support column 56.

An annular stepped portion 76 is provided on an upper surface of the circumferential portion of the placement table 58 to accommodate the pressing portion 74A. Thus, a central upper surface of the placement table 58 and an upper surface of the pressing portion 74A are positioned on a same horizontal plane, whereby no turbulent flow is generated in a flow of the processing gas.

An annular flange portion 74B is formed in a lower portion of the pressing member 74. The flange portion 74B is attached to the base plate 60 via plural bolts 78 provided at equal intervals along a periphery of flange portion 74B and resilient members, e.g., coil springs 80, respectively stuck on the bolts 78 such that it can move upward while being pressured downward by the coil springs 80. The bolts 78 and coil springs 80 are made of high corrosion resistant material, e.g., Inconel (a registered trademark).

There is a small gap between a lower surface of the flange portion 74B and an upper surface of the base plate 60. Accordingly, a cylindrical gap (having a width L3 of, e.g., about 0.3 mm) formed between an outer circumferential surface of the cylindrical support column 56 and an inner circumferential surface of the cylindrical pressing member 74 can be used as a purge gas discharge flow path 82. A purge gas discharged from the above-mentioned narrow flow path 68 flows downward along the purge gas discharge flow path 82, and then it is discharged out through the gap between a lower surface of the flange portion 74B and an upper surface of the base plate 60.

Further, a purge gas introduction passage 84 serving as a second purge gas feeding unit is formed such that it passes through the bottom wall 32 of the processing chamber 22 and the base plate 60. The purge gas whose flow rate is controlled can be introduced into a space S1 under the placement table 58 inside the cylindrical support column 56 from a gas source (not shown) through the purge gas introduction passage 84. For example, a N$_2$ gas or a nonreactive gas such as an Ar gas can be used as the purge gas, and a N$_2$ gas is used in the present embodiment.

A cylindrical flow path forming member 86 is disposed on the base plate 60 and separated inwardly by a gap of a specified width from the support column 56, whereby a cylindrical purge gas outlet passage 88 is formed between an outer circumferential surface of the flow path forming member 86 and an inner circumferential surface of the support column 56 disposed at an outside thereof. A top end of the flow path forming member 86 is separated slightly from the placement table 58, and the purge gas supplied in the space S1 under the placement table 58 flows into the purge gas outlet passage 88 from a top end thereof and flows down therethrough. The flow path forming member 86 is formed of a heat resistant material, e.g., transparent quartz. A width L4 of the purge gas outlet passage 88 is about 1.0 mm, for example.

A plurality of, e.g., four (see FIG. 3), gas holes 90 are formed at approximately equal intervals in a bottom portion of the purge gas outlet passage 88, i.e., on an upper surface of the base plate 60 in a circumferential direction thereof. Connected to the gas holes 90 are purge gas passages 92 passing through the bottom wall 32 of the processing chamber 22 and the base plate 60 and communicating with the lines 36 of the vacuum exhaust system 38. The purge gas passages 92 respectively include through holes (through paths) 94 which penetrate the base plate 60 and the bottom wall 32; outlets 94A of the through holes 94; and outer attached lines 96 which are, for example, stainless lines connected to openings 36A disposed on sidewalls of the lines 36. The outer attached line 96 is set to have a length equal to or longer than, e.g., about 30 cm, that is long enough to prevent an unreacted processing gas flowing in the line 36 from entering into the space S1 under the placement table 58 even if the unreacted processing gas is diffused in the outer attached line 96 in a reverse direction to the purge gas flow. Further, a proper length of the outer attached line 96 depends on an inner diameter of the outer attached line 96.

Disposed in a circumferential portion of the base plate 60 is a cooling jacket 98 for cooling the base plate 60 by circulating a coolant such as cooling water along a periphery of the base plate 60. Further, installed in an outer periphery of the pressing member 74 is a lifting mechanism (not shown) for elevating the wafer W while supporting the lower surface of the circumferential portion of the wafer W when transferring the wafer W or mounting it on the placement table 58.

Hereinafter, there will be explained an operation of the heat-treating apparatus.

First, an unprocessed semiconductor wafer W is introduced into the processing chamber 22 through an opened gate valve 30 and mounted on the placement table 58. Then, after sealing the processing chamber 22, the heat rays are irradiated on the lower surface of the placement table 58 by turning on the heating lamps 52 of the heating lamp unit 48, whereby a temperature of the wafer W mounted on the upper surface of the placement table 58 is raised to a specified processing temperature, e.g., 700° C., and the specified temperature is maintained.

At the same time, a SiH$_4$ gas, a H$_2$ gas and a N$_2$ gas serving as a processing gas are supplied into the processing space S in the processing chamber 22 from the shower head 24. The SiH$_4$ gas and the H$_2$ gas have a pyrolysis reaction to thereby deposit a polysilicon film on the surface of the wafer W. Since the processing chamber 22 is exhausted to vacuum, various unreacted gases and a reaction by-product gas flow down from the periphery of the placement table 58 approximately uniformly, and then flow into the lines 36 of the vacuum exhaust system 38 through the gas exhaust port 34 to be discharged outside. Under such a condition, if there is a small gap, the SiH$_4$ gas and the H$_2$ gas having a very large diffusion coefficient enter into the space S1 under the placement table 58 through the gap, whereby an unnecessary film may be deposited on the lower surface of the placement table 58 or the upper surface of the transmission window 42.

However, in the present embodiment, a N$_2$ gas serving as a purge gas is supplied into the space S1 through the purge gas introduction passage 84 and, further, into the top portion of the support column 56 through the purge gas introduction passages 66. Therefore, the SiH$_4$ gas and the H$_2$ gas can be prevented from entering into the space S1. As shown in FIG. 2, the purge gas supplied in the space S1 from the purge gas introduction passage 84 moves up in the space S1 and changes its direction in proximity to the lower surface of the placement table 58 as indicated by an arrow 100 to flow down in the purge gas outlet passage 88. Further, the purge gas passes through the purge gas passages 92 including the through paths 94 and the outer attached lines 96 and flows into vacuum exhausted lines 36. Thereafter, the purge gas and gases issued from the processing space S flow together in the lines 36 to be discharged outside the system.

At this time, an unreacted SiH$_4$ gas or an unreacted H$_2$ gas flowing in the lines 36 may enter into the space S1 by diffusing in the outer attached lines 96, the through paths 94 and the purge gas outlet passages 88 in a reverse direction to the purge gas. However, the lines 36 are strongly exhausted to vacuum by a vacuum pump (not shown). Accordingly, the SiH$_4$ gas or the H$_2$ gas hardly enters into the purge gas passages 92. Further, the length of the outer attached lines 96 is, e.g., about 30 cm that is sufficiently long. Furthermore, since the flow path forming member 86 is shaped as a cylinder with the approximately same height as the support column 56, the vertical length of the purge gas outlet passage 88 formed outside the flow path forming member 86 is also long. Consequently, even if the SiH$_4$ gas or the H$_2$ gas can enter into the purge gas passages 92, it cannot reach the space S1. Further, a flow rate of the purge gas supplied through the purge gas introduction passage 84 is, e.g., about 1000 sccm, but it is not limited thereto.

Further, the SiH$_4$ gas and the H$_2$ gas in the processing space S may diffuse into the purge gas discharge flow path 82 in the reverse direction to the purge gas flow to thereby enter into the space S1 under the placement table 58 through the gap between the supporting surface 62 and the lower surface of the placement table 58. But, the purge gas made of $N_2$ gas is supplied into the purge gas groove 64 formed at the top portion of the support column 56 through the purge gas introduction passages 66 and diffuses in the purge gas groove 64 in a circumferential direction. After passing through the narrow flow path 68, the purge gas is issued into the purge gas discharge flow path 82 and flows down therein. At a lower portion of the purge gas discharge flow path 82, the purge gas arrives at the gas exhaust port 34 through a gap between the base plate 60 and the flange portion 74B of the pressing member 74 and then is discharged outside the system via the lines 36 of the vacuum exhaust system 38. At this time, since a vertical width L1 of the narrow flow path 68 is very small, i.e., a few to several tens of μm, a flow speed of the purge gas flowing outward in the narrow flow path 68 becomes very high. Accordingly, the $SiH_4$ gas and the $H_2$ gas are certainly prevented from diffusing in the reverse direction to the purge gas flow and entering into the space S1. Further, since the pressing member 74 is shaped as a cylinder with the approximately same height as the support column 56, the vertical length of the purge gas discharge flow path 82 formed inside the pressing member 74 is also long. Consequently, it is possible to prevent the $SiH_4$ gas and the $H_2$ gas from diffusing up to the top portion of the purge gas discharge flow path 82.

Further, both the supporting surface 62 of the support column 56 and the lower surface of the placement table 58 in contact therewith are mirror finished, so that they are in a surface contact approximately uniformly in a circumferential direction without a gap. Therefore, even if the $SiH_4$ gas and the $H_2$ gas enter into the purge gas groove 64 through the narrow flow path 68, it is possible to prevent them from entering into the space S1 under the placement table 58. Further, the purge gas supplied into the space S1 can be prevented from locally leaking from a gap between the supporting surface 62 of the support column 56 and the lower surface of the placement table 58 in contact therewith. Thus, a local cooling of the placement table 58 caused by a local leakage of the purge gas does not occur to thereby increase in-surface uniformity of temperature in the placement table 58 and the wafer W. Further, the flow rate of the purge gas supplied through the purge gas introduction passages 66 is, e.g., about 500 to 1000 sccm, but it is not limited thereto. Furthermore, even if the $SiH_4$ gas and the $H_2$ gas enter the space S1 through the gap between the supporting surface 62 of the support column 56 and the lower surface of the placement table 58 in contact therewith, since there exists an air flow 100 of the purge gas flowing along the purge gas outlet passage 88 in proximity of the supporting surface 62, the gases are immediately discharged along with the air flow 100.

In the conventional heat-treating apparatus, when a pressure in the space under the placement table is increased by supplying purge gas thereto at a high flow rate, a high pressure is applied to the whole placement table to thereby make it possible to damage the placement table. However, in the present embodiment, even though a purge gas flows at a high flow rate through the purge gas introduction passages 66, a high pressure is exerted only to a small-area portion defining the narrow flow path 68 and there is no possibility of damaging the placement table 58. Therefore, as long as there is no problem in temperature distribution of the placement table 58, a flow rate of purge gas supplied from the purge gas introduction passages 66 can be increased, whereby the $SiH_4$ gas and the $H_2$ gas can be definitely prevented from entering into the space S1 under the placement table 58.

Further, the circumferential portion of the placement table 58 is maintained by the pressing portion 74A of the pressing member 74 which is made of a low heat conductive material such as quartz to thereby reduce an amount of heat lost through the pressing portion 74A from the circumferential portion of the placement table 58. Thus, there is no bad influence on the in-surface uniformity of temperature of the wafer W.

Additionally, when a large upward force is applied to the placement table 58 by a pressure unexpectedly abnormally decreased in the processing space S or a pressure accidentally increased in the space S1 under the placement table 58, the placement table 58 and the pressing member 74 for fastening the placement table 58 temporarily rise against a spring force of the coil springs 80 for fixing the lower portion of the pressing member 74. Accordingly, a pressure difference between the space S1 and the processing space S can be reduced to thereby prevent the placement table 58 from being damaged.

Second Preferred Embodiment

Figure 4:
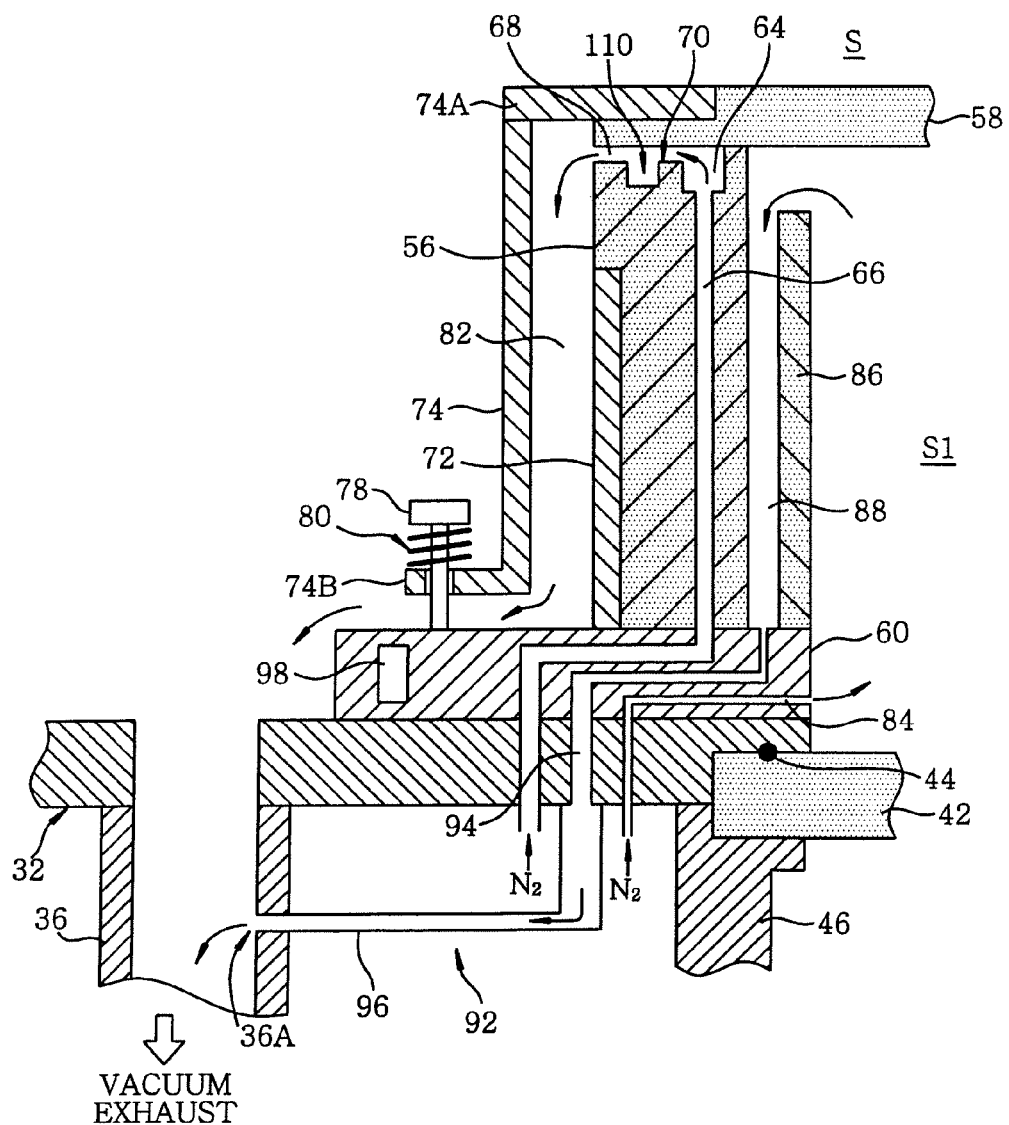
FIG. 4 offers a magnified sectional view showing a support column and its neighboring members in accordance with a second preferred embodiment of the present invention.
Figure 5:
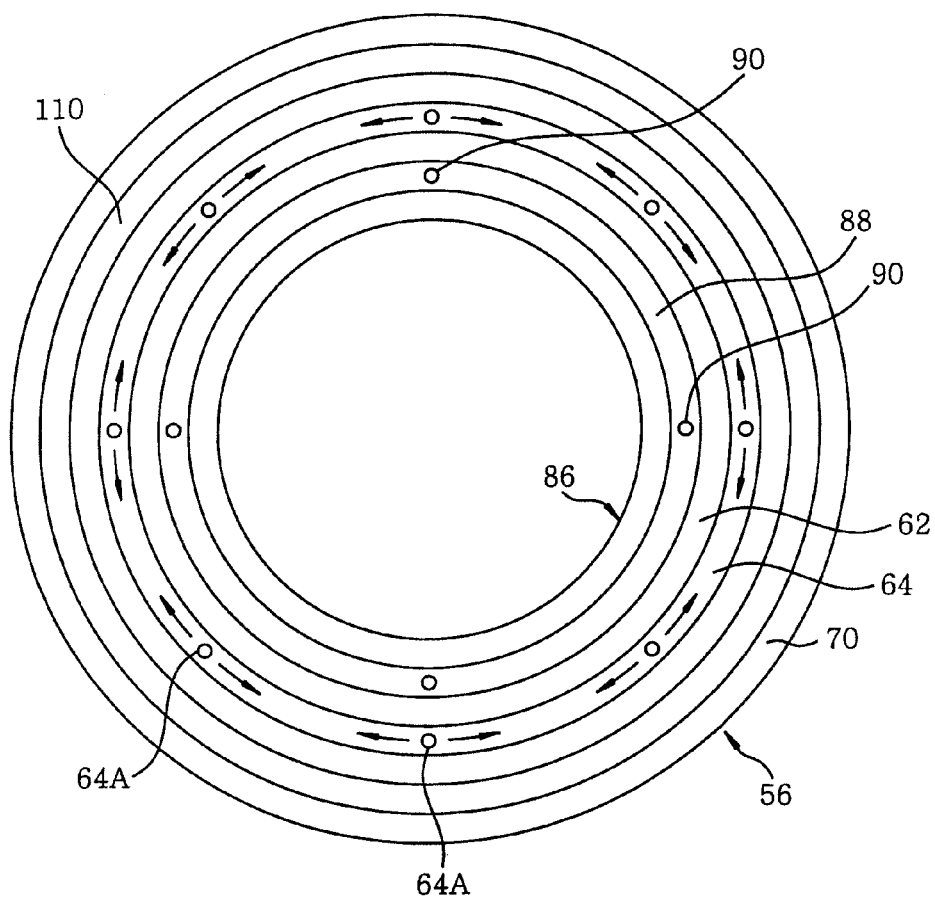
FIG. 5 presents a magnified plan view showing the support column in accordance with the second preferred embodiment of the present invention.

Hereinafter, there will be described a second preferred embodiment of the present invention with reference to FIGS. 4 and 5. FIG. 4 offers a magnified sectional view showing a support column and neighboring members in accordance with the second preferred embodiment of the present invention; and FIG. 5 presents a plan view showing the support column in accordance with the second preferred embodiment. In FIGS. 4 and 5, parts having the same functions as the parts shown in FIGS. 1 to 3 will be assigned like reference numerals, and description thereof will be omitted.

The upper surface 70 of the outer circumferential portion of the support column 56, for defining the narrow flow path 68, is flat in the above-mentioned first preferred embodiment (see FIG. 2), whereas an annular labyrinth groove 110 extending in a circumferential direction is formed at an approximately central portion of an upper surface 70 in the second preferred embodiment.

A depth and a width of the labyrinth groove 110 are about 2.0 mm and 1.0 mm, respectively. Only one labyrinth groove 110 is provided in the illustrated embodiment, but a plurality of labyrinth grooves may be provided in a concentric circular shape. Even if a $SiH_4$ gas and a $H_2$ gas enter into the narrow flow path 68 by diffusing in the purge gas discharge flow path 82 outside the narrow flow path 68 in a reverse direction to the purge gas flow, the labyrinth groove 110 disposed in the narrow flow path 68 allows the $SiH_4$ gas and the $H_2$ gas to stay in the labyrinth groove 110 to thereby prevent them from diffusing into the purge gas groove 64. Thus, such a configuration can certainly prevent the gases from entering the space S1 under the lower surface.

Further, though there is described an exemplary case of forming the polysilicon film as a heat treatment in the above-mentioned preferred embodiments, the present invention can be applied to heat-treating apparatuses for performing another heat treatment, for example, a heat treatment for forming another kind of film and a heat treatment such as an oxidation/diffusion process and a modification process in addition to a film forming process, without being limited thereto. Further, an object to be processed by the heat-treating apparatus is not limited to a semiconductor wafer and may be an LCD substrate, a glass substrate, and the like.

Related Arts

Hereinafter, there will be described related arts of the present invention with reference to FIGS. 6A and 6B.

Figure 6A:
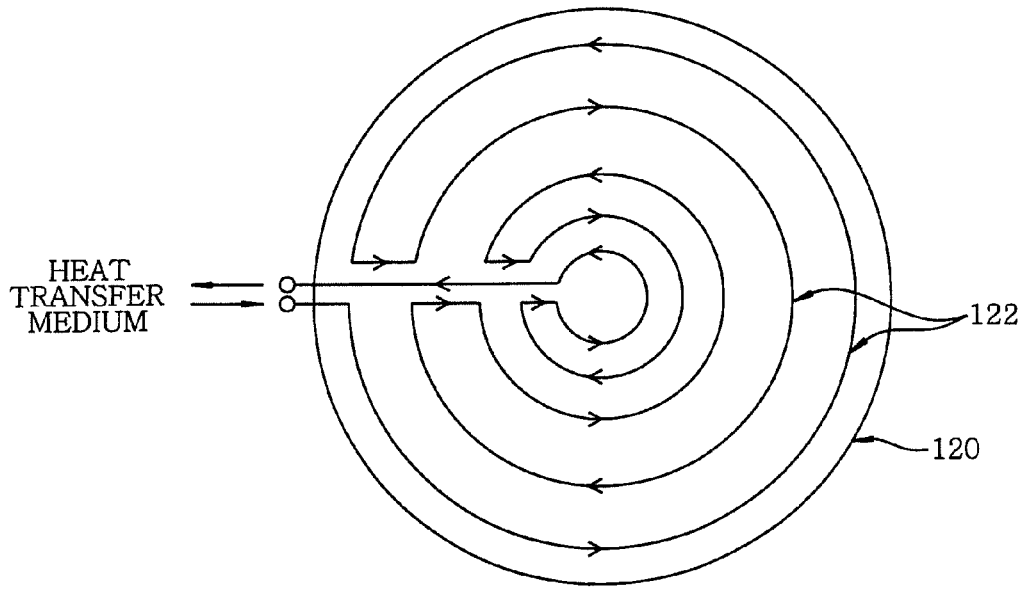
FIGS. 6A and 6B represent explanatory diagrams for explaining related arts of the present invention.

FIG. 6A depicts a conventional arrangement of the medium passage 122, provided in a part 120 such that the heat-treating apparatus cools or heats the part 120. An exit side end portion of the medium passage 122 is linearly extended outwardly from a central portion of the part 120 in a radial direction. Meanwhile, the medium passage 122 starts from an entrance side end portion of a circumferential portion of the part 120; is extended counter-clockwise in a circumferential direction; after changing a direction thereof near to an exit side end portion, is extended inwardly in a radial direction; is extended clockwise in a circumferential direction; after changing a direction thereof near to the exit side end portion, is extended inwardly in a radial direction; is extended counter-clockwise in a circumferential direction; and is repeatedly extended likewise to thereby reach the central portion of the part 120. A heat medium flows around in the medium passage 122 starting from the circumferential portion of the part 120 and gradually approaches the central portion. After reaching the central portion, the heat medium is discharged outwardly in a radial direction. Further, there is a part in which the heat medium flows in a reverse direction.

In such a manner of heat medium flow, there is generated heat distribution due to a large temperature difference between portions where the heat medium flows at the beginning and afterwards, that is, the circumferential portion and the central portion of the part 120 in this case. Consequently, the part 120 cannot be heated or cooled with a sufficiently uniform in-surface temperature.

Figure 6B:
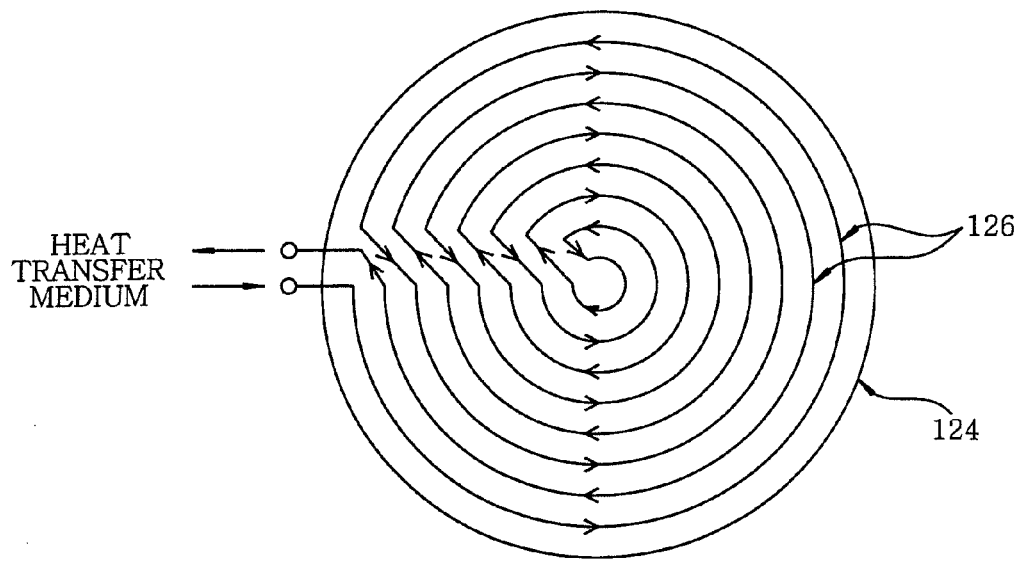
Figure 7:
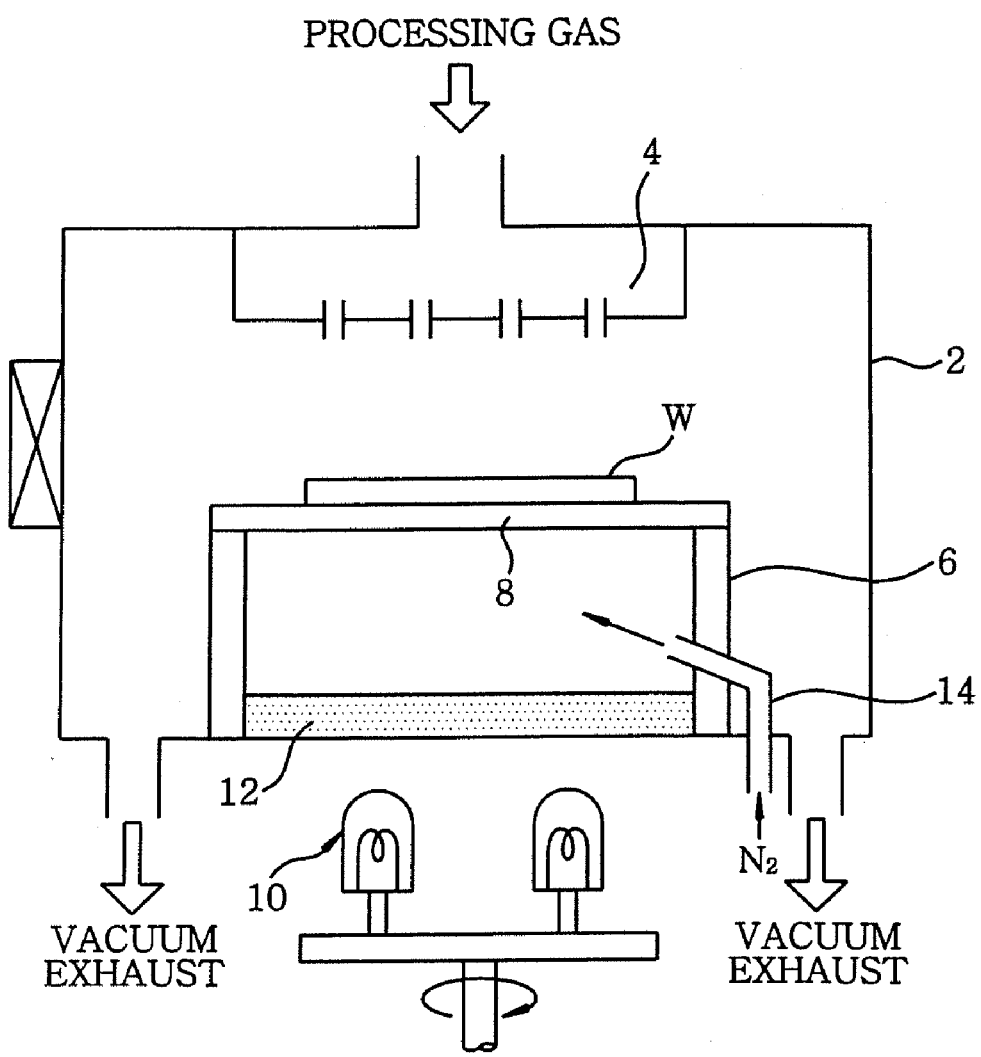
FIG. 7 sets forth a schematic view showing a configuration of a conventional general single-wafer heat-treating apparatus.

A medium passage improved to overcome such a drawback, is represented in FIG. 6B. A medium passage 126 provided in a part 124 starts from an entrance side end portion of a circumferential portion of the part 124; is spirally extended counter-clockwise to a central portion thereof; is inverted after reaching the central portion; and is spirally extended clockwise to the circumferential portion.

In the medium passage 126 thus formed, a heat medium (a cooling medium or a heating medium) flows spirally from the circumferential portion to the central portion. Then, reversely, the heat medium flows spirally from the central portion to the circumferential portion. Therefore, the part 124 can be cooled or heated with a sufficiently uniform in-surface temperature.

The part 124 can become a part that needs to be cooled or heated as one used in a semiconductor wafer heat-treating apparatus, a plasma processing apparatus or the like, for example, a shower head or a bottom portion of a processing chamber.

While the invention has been shown and described with respect to the preferred embodiments, it will be understood by those skilled in the art that various changes and modifications may be without departing from the spirit and scope of the invention as defined in the following claims.

What is claimed is:

1. A heat treatment apparatus, comprising:
   an evacuatable processing chamber;
   a cylindrical support column extending upward from a bottom portion of the processing chamber;
   a placement table of a plate shape, supported on a top end of the support column, for mounting an object to be processed thereon;
   a heating lamp that heats the object mounted on the placement table; and
   a gas feeding unit that supplies a processing gas in the processing chamber,
   wherein a supporting surface extends in a circumferential direction at an inner circumferential portion of a top portion of the cylindrical support column to support a lower surface of a circumferential portion of the placement table in contact therewith,
   a purge gas groove for flowing a purge gas therein is formed in a circumferential direction at an intermediate circumferential portion of the top portion of the cylindrical support column,
   a flow path that discharges the purge gas flowing in the purge gas groove while preventing the processing gas from entering into the purge gas groove is disposed around an outer circumferential portion of the cylindrical support column, and
   a purge gas feeding unit that supplies the purge gas in the purge gas groove is installed.

2. The heat treatment apparatus of claim 1, wherein a groove is disposed at the outer circumferential portion of the top portion of the cylindrical support column.

3. The heat treatment apparatus of claim 1, wherein a cylindrical pressing member having a pressing portion that presses an upper surface of the circumferential portion of the placement table is disposed in a radial direction outside the cylindrical support column at a specified interval, whereby a purge gas discharge flow path is formed between an inner circumferential surface of the pressing member and an outer circumferential surface of the support column and the purge gas discharged from the flow path flows down therethrough.

4. The heat treatment apparatus of claim 3, wherein the pressing member comprises a low heat conductive material.

5. The heat treatment apparatus of claim 3, wherein a lower portion of the pressing member is fixed at the bottom portion of the processing chamber via a resilient member, whereby the placement table is movable upward by resiliently deforming the resilient member when an upward force is applied to the placement table.

6. The heat treatment apparatus of claim 1, wherein both the supporting surface and the lower surface of the circumferential portion of the placement table in contact with the supporting surface are mirror finished.

7. The heat treatment apparatus of claim 1, wherein a light blocking member is installed at the support column to prevent light emitted from the heating lamp from leaking outward in a radial direction of the support column.

8. The heat treatment apparatus of claim 7, wherein the light blocking member is formed of a light reflective member.

9. The heat treatment apparatus of claim 1, further comprising a purge gas feeding unit that supplies a purge gas in a space under the placement table inside the support column.

10. The heat treatment apparatus of claim 9, wherein a cylindrical flow path forming member is disposed inward in a radial direction of the cylindrical support column at a specified interval, and formed between an inner circumferential surface of the support column and an outer circumferential surface of the flow path forming member is a purge gas outlet passage through which the purge gas supplied in the space under a lower surface of the placement table flows down, having a lower portion connected to a vacuum exhaust system for exhausting the processing chamber to vacuum via a purge gas passage.

11. The heat treatment apparatus of claim 10, wherein the flow path forming member is made of transparent quartz.

12. The heat treatment apparatus of claim 1, wherein the support column comprises transparent quartz.

13. The heat treatment apparatus of claim 1, wherein the distance from the placement table to the outer circumferential portion of the top portion of the cylindrical support column is smaller than the distance from the placement table to the purge gas groove.

14. The heat treatment apparatus of claim 1, wherein the purge gas is supplied from the bottom portion of the processing chamber to the purge gas groove via a flow path formed in the cylindrical support column.

* * * * *